(12) United States Patent
Basceri

(10) Patent No.: US 6,335,049 B1
(45) Date of Patent: Jan. 1, 2002

(54) CHEMICAL VAPOR DEPOSITION METHODS OF FORMING A HIGH K DIELECTRIC LAYER AND METHODS OF FORMING A CAPACITOR

(75) Inventor: Cem Basceri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/476,516

(22) Filed: Jan. 3, 2000

(51) Int. Cl.[7] .......................... C23C 16/40; B05D 5/12; B05D 1/36; H01L 21/20
(52) U.S. Cl. .......................... 427/79; 427/576; 427/81; 427/126.3; 427/255.19; 427/255.31; 427/255.36; 427/255.391; 427/419.2; 438/381; 438/763
(58) Field of Search .......................... 427/576, 79, 81, 427/126.3, 255.19, 255.28, 255.29, 255.31, 255.36, 255.391, 419.2; 438/386, 393, 396, 763, 381

(56) References Cited

U.S. PATENT DOCUMENTS

| | | | |
|---|---|---|---|
| 5,254,505 A | 10/1993 | Kamiyama | 437/235 |
| 5,256,455 A * | 10/1993 | Numasawa | 427/576 |
| 5,459,635 A * | 10/1995 | Tomozawa et al. | 361/321.5 |
| 5,470,398 A | 11/1995 | Shibuya et al. | 148/33.3 |
| 5,596,214 A | 1/1997 | Endo | 257/324 |
| 5,618,761 A * | 4/1997 | Eguchi et al. | 438/785 |
| 5,731,948 A * | 3/1998 | Yializis et al. | 361/313 |
| 5,776,254 A * | 7/1998 | Yuuki et al. | 118/725 |
| 5,783,253 A | 7/1998 | Roh | 427/81 |
| 5,798,903 A | 8/1998 | Dhote et al. | 361/321.4 |
| 6,037,205 A | 3/2000 | Huh et al. | 438/240 |
| 6,043,526 A | 3/2000 | Ochiai | 257/295 |
| 6,046,345 A * | 4/2000 | Kadokura et al. | 556/1 |
| 6,078,492 A * | 6/2000 | Huang et al. | 361/301.4 |
| 6,153,898 A | 11/2000 | Watanabe et al. | 257/295 |
| 6,156,638 A | 12/2000 | Agarwal et al. | |
| 6,165,834 A | 12/2000 | Agarwal et al. | |

FOREIGN PATENT DOCUMENTS

| | | |
|---|---|---|
| EP | 0 474 140 A1 | 3/1992 |
| EP | 0 855 735 A2 | 7/1998 |
| EP | 0 957 522 A2 | 11/1999 |
| WO | WO 98/39497 | 9/1998 |
| WO | WO 99/64645 | 12/1999 |

OTHER PUBLICATIONS

T.W. Kim, et al., "Structural and electrical properties of $BaTiO_3$ grown on p–InP (100) by low–pressure metalorganic chemical vapor deposition at low temperature." Applied Physics Letters;65 (1994) Oct. 10, No. 15, Woodbury, NY, US., p. 1995–1997.

T. Arai, et al., "Preparation of $SrTiO_3$ Films on 8–Inch Wafers by Chemical Vapor Deposition", Jpn. J. Appl. Phys. vol. 35 (1996), Part 1 No. 9B, Sep. 1996, pp. 4875–4879.

(List continued on next page.)

Primary Examiner—Michael Barr
(74) Attorney, Agent, or Firm—Wells, St. John, Roberts, Gregory & Matkin P.S.

(57) ABSTRACT

A chemical vapor deposition method of forming a high k dielectric layer includes positioning a substrate within a chemical vapor deposition reactor. At least one metal comprising precursor and $N_2O$ are provided within the reactor under conditions effective to deposit a high k dielectric layer on the substrate comprising oxygen and the metal of the at least one metal precursor. The $N_2O$ is present within the reactor during at least a portion of the deposit at greater than or equal to at least 90% concentration by volume as compared with any $O_2$, $O_3$, NO, and $NO_X$ injected to within the reactor. In one implementation, the conditions are void of injection of any of $O_2$, $O_3$, NO, and $NO_X$ to within the reactor during the portion of the deposit. In one implementation, a capacitor is formed using the above methods. In preferred implementations, the technique can be used to yield smooth, continuous dielectric layers in the absence of haze or isolated island-like nuclei.

37 Claims, 1 Drawing Sheet

OTHER PUBLICATIONS

Choi, Y.C., et al., Abstract, "Improvements of the properties of Chemical–Vapor–Deposited (Ba, Sr) $TiO_3$ Films through Use of a Seed Layer", *Jpn. J. Appl. Phys.*, Part 1, vol. 35, No. 11, pp. 6824–6828 (1997).

Kim, Yong Tae, et al., Abstract, "Advantages of RuO/sub x/Bottom Electrode in the Dielectric and Leakage Characteristics of (Ba,Sr)TiO/sub 3/capacitor", *Jpn. J. Appl. Phys.*, Part 1, vol. 35, No. 12A, pp. 6153–6 (Dec. 1996).

Jia, Q.X., et al., Abstract, "Structural and Dielectric Properties of Ba/sub 0.5/Sr/sub 0.5/TiO/sub 3/thin films with an epi–RuO/sub 2/bottom electrode", *Integrated Ferroelectrics*, vol. 19, No. 1–4, pp. 111–19 (1998).

Chu, Chung Ming, et al., Abstract, "Electrical properties and Crystal Structure of (Ba,Sr)TiO/sub 3/films prepared at Low Temperatures on a LaNiO/sub 3/electrode by radio–frequency magnetron sputtering", *Applied Physics Letter*, vol. 70, No. 2, pp. 249–51 (Jan. 13, 1997).

Takeuchi, N., et al., Abstract, Effect of Firing Atmosphere on the Cubic–Hexagonal Transition in Ba/sub 0.99/Sr/sub 0.01/TiO/sub 3/, *Nippon seramikkusu Kyokai Gakujutsu Ronbunshi*, vol. 98, No. 8, pp. 836–9 (1990).

Paek, S.H., et al., Abstract, "Characterization of MIS Capacitor of BST Thin Film s Deposited on Si by RF Magnetron Sputtering", *Material. Res. Soc.*, Pittsburgh, PA, *Ferroelectric Thin Films V. Symp.*, pp. 33–8 (Apr. 7, 1996).

Yamaguchi, H., et al., Abstract, Reactive Coevaporation Synthesis and Characterization of SrTiO/sub 3/–BaTiO/sub3/ Thin Films, *I.E.E.E.*, 644 pp. (Aug. 30, 1992).

Yamamichi, S., Abstract, "Ba +Sr)/Ti Ratio Dependence of the Dielectric properties for (Ba/sub 0.5/)Sr/sub 0.5/TiO/Sub 3/ Thin Films Prepared by Ion Beam Sputtering", *Applied Physics Letters*, vol. 64, No. 13, pp. 1644–6 (Mar. 28, 1994).

Eguchi, et al., Abstract, "Chemical Vapor Deposition of (Ba,Sr)Ti)//3 Thin Films for Application in Gigabit Scale Dynamic Random Access Memories", *Integrated Ferroelectrics*, vol. 14, No. 1–4, Pt. 1, pp. 33–42 (1997).

Yamamuk, M., et al., Abstract, "Thermal–Desorption of $(Ba,Sr)TiO_3$ Thin Films Prepared by Chemical–Vapor Deposition", *Japanese Journal of Applied Physics Part I*, vol. 35, No. 2A, pp. 729–735 (Feb. 1996).

Yamamichi, S., et al., Abstract, "Ba +Sr)/Ti Ratio Dependence of the Dielectric properties for (BaSub0Sub.Sub5SrSub0Sub.Sub5)Tio Sub 3 Thin Films Prepared by Ion Beam Sputtering", *Applied Phys. Letters*, vol. 64(13), pp. 1644–46 (1994).

Khamankar, Rajesh, et al., "A Novel Low–Temperature Process for High Dielectric Constant BST Thin Films for UlSI DRAM Applications", *Microelectronics Research Center*, Univ. of Texas At Austin, Austin, TX 2 pp. (Undated).

Kawahara, Takaaki, et al., "(Ba, $Sr)TiO_3$ Films Prepared by Liquid Source Chemical Vapor Deposition on Ru Electrodes", *Appl. Phys.*, vol. 35, Pt. 1, No. 9B, pp. 4882–3 (1996).

Bilodeau, Steve M., et al., Abstract: "MOCVD BST for High Density DRAM Applications", *Advanced Technology Materials, Inc.*, CVD Technologies for Inter–Level Dielectrics and Interconnects Symposium, Danbury CT, 2 pp. (Jul. 12, 1995).

Bilodeau, Steve M., et al., "Composition Dependence of the Dielectric Properties of MOCVD $Ba_xSr_{1-x}TiO_3$", *Applied Technology Materials*, MRS Fall Meeting, pp. 1–21 (Dec. 1, 1994).

* cited by examiner

CHEMICAL VAPOR DEPOSITION METHODS OF FORMING A HIGH K DIELECTRIC LAYER AND METHODS OF FORMING A CAPACITOR

TECHNICAL FIELD

This invention relates to chemical vapor deposition methods of forming a high K dielectric layer and to methods of forming a capacitor.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs and beyond will be on the order of 0.25 micron or less, and conventional dielectrics such as $SiO_2$ and $Si_3N_4$ might not be suitable because of small dielectric constants.

Highly integrated memory devices, such as 256 Mbit DRAMs, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials (such as ferroelectric materials, perovskite materials and pentoxides) are commonly referred to as "high k" materials due to their high dielectric constants, which make them attractive as dielectric materials in capacitors, for example for high density DRAMs and non-volatile memories. In the context of this document, "high k" means a material having a dielectric constant of at least 20. Such materials include tantalum pentoxide, barium strontium titanate, strontium titanate, barium titanate, lead zirconium titanate and strontium bismuth tantalate. Using such materials enables the creation of much smaller and simpler capacitor structures for a given stored charge requirement, enabling the packing density dictated by future circuit design.

SUMMARY

The invention comprises chemical vapor deposition methods of forming a high K dielectric layer and methods of forming a capacitor. In one implementation, a chemical vapor deposition method of forming a high k dielectric layer includes positioning a substrate within a chemical vapor deposition reactor. At least one metal comprising precursor and $N_2O$ are provided within the reactor under conditions effective to deposit a high k dielectric layer on the substrate comprising oxygen and the metal of the at least one metal precursor. The $N_2O$ is present within the reactor during at least a portion of the deposit at greater than or equal to at least 90% concentration by volume as compared with any $O_2$, $O_3$, NO, and $NO_X$ injected to within the reactor. In one implementation, the conditions are void of injection of any of $O_2$, $O_3$, NO, and $NO_X$ to within the reactor during the portion of the deposit.

In one implementation, a method of forming a capacitor includes forming a first capacitor electrode layer over a substrate. The substrate with the first capacitor electrode layer is positioned within a chemical vapor deposition reactor. At least one metal comprising precursor and $N_2O$ are provided within the reactor under conditions effective to deposit a high k capacitor dielectric layer comprising oxygen and the metal of the at least one metal precursor over the first capacitor electrode. The $N_2O$ is present within the reactor during at least a portion of the deposit at greater than or equal to at least 90% concentration by volume as compared with any $O_2$, $O_3$, NO, and $NO_X$ injected to within the reactor to form an outermost surface of the capacitor dielectric layer at conclusion of the portion to have a roughness of no greater than 20 Angstroms as determinable by average atomic force microscopy RMS roughness. A second capacitor electrode layer is formed over the high k capacitor dielectric layer.

In preferred implementations, the technique can be used to yield smooth, continuous dielectric layers in the absence of haze or isolated island-like nuclei.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
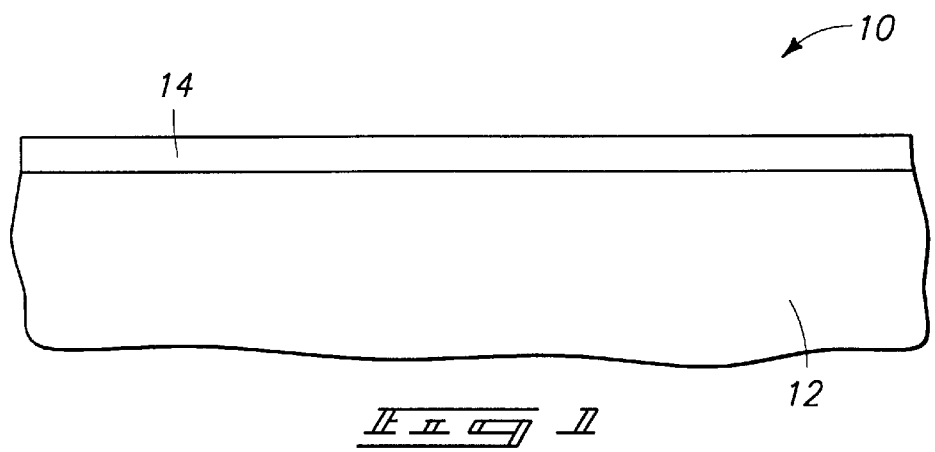
FIG. 1 is a diagrammatic sectional view of a semiconductor wafer fragment at one processing step in accordance with an aspect of the invention.

This disclosure of the invention is submitted in furtherance of the constitutional purposes of the U.S. Patent Laws "to promote the progress of science and useful arts" (Article 1, Section 8).

The invention was motivated from problems associated with achieving thin continuous films in deposition of barium strontium titanate (BST) as some or all of the capacitor dielectric region to be received intermediate a pair of capacitor electrodes. Film discontinuity resulted in certain metal organic chemical vapor deposition (MOCVD) processes when film thickness started to fall to at or below 300 Angstroms. Film discontinuity is typically highly undesirable, particularly in capacitor, where fatal plate-to-plate shorts can occur through a discontinuous capacitor dielectric layer.

The existing, not necessarily prior art, process within which these discontinuous films manifested utilized a plurality of MOCVD precursors collectively having barium, strontium and titanium therein. Carrier gases and one or more oxidizers were provided within the reactor with the MOCVD precursors to deposit a desired BST film on a substrate. The oxidizers which were utilized were either 100% $O_2$ or a 50—50 mix of $O_2$ and $N_2O$. Discontinuity in the subject layer manifested in many cases where deposition thickness fell to at or below 300 Angstroms. Such could be determined by scanning electron microscopy, and by measurement of surface roughness which turned out to be an indication of discontinuity in such films.

As deposition temperatures started to exceed 600° C. on the susceptor during deposition, discontinuity problems started to disappear at deposition thicknesses at and below 300 Angstroms. However, such higher temperatures tended to result in poorer conformality in the deposition in spite of improved continuity in the deposited layer. Further, such higher temperature depositions started to result in a hazy appearance and roughness in the deposited layer. Roughness either from discontinuity or haze at the higher temperatures tended to be greater than 100 Angstroms, including some around 1000 Angstroms, as determined by average atomic force microscopy RMS roughness.

Such describes the background upon which the invention was motivated. However, the invention is in no way so limited, with the invention only being limited and defined by the accompanying claims as literally worded and as appropriately interpreted in accordance with the Doctrine of Equivalents. Aspects of the invention are seen applicable to chemical vapor deposition methods of forming high k dielectric layers other than titanates or barium strontium titanate, and other than in the fabrication of capacitors. Further, the invention is perceived and supported by the accompanying claims and in accordance with the Doctrine of Equivalents independent of whether some or all of the above implied objects are achieved unless otherwise literally included in an accompanying specific claim. A preferred embodiment description proceeds with the fabrication of an exemplary capacitor with respect to FIGS. 1–3.

FIG. 1 depicts a wafer fragment 10 comprising a substrate 12. Substrate 12 might comprise one or more layers of, for example, insulative, semiconductor or conductive materials. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A first conductive capacitor electrode layer 14 is formed over substrate 12. Any suitable conductive material is contemplated, such as by way of example only, conductively doped polysilicon, platinum, titanium nitride and other existing or to-be-developed materials. An exemplary thickness range for layer 14 is from 50 Angstroms to 1000 Angstroms.

Figure 2:
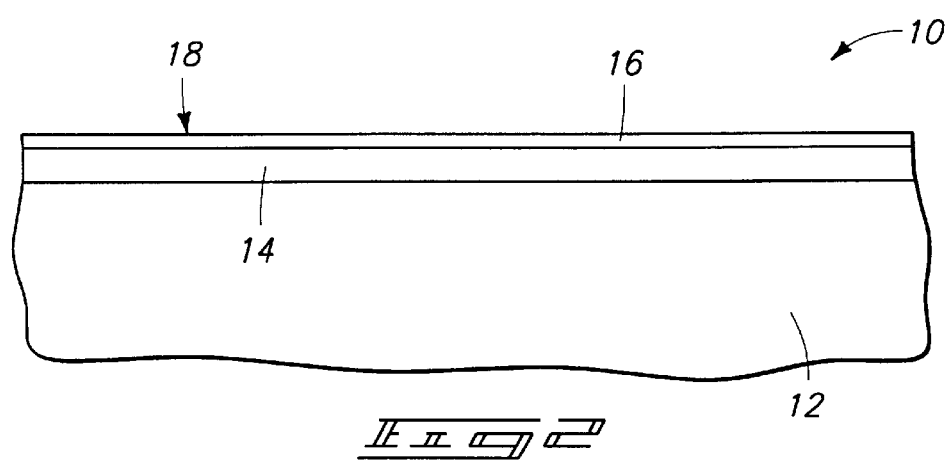
FIG. 2 is a view of the FIG. 1 wafer fragment at a processing step subsequent to that shown by FIG. 1.

Referring to FIG. 2, substrate 10 is positioned within a chemical vapor deposition reactor (not shown). At least one metal precursor and $N_2O$ are provided within the reactor under conditions effective to deposit a high k dielectric layer 16 on substrate 10 which comprises oxygen and the metal of the at least one metal precursor. The $N_2O$ is present within the reactor during at least a portion of the deposit at greater than or equal to at least 90% concentration by volume as compared with any $O_2$, $O_3$, NO, and $NO_X$ which might be injected to within the reactor. Preferably, the $N_2O$ is present within the reactor during the portion of the deposit at greater than or equal to at least 95% concentration by volume as compared with any $O_2$, $O_3$, NO, and $NO_X$ which might be injected to within the reactor and more preferably greater than or equal to at least 99% concentration. Even more preferably, the $N_2O$ is present within the reactor during the portion of the deposit at 100% concentration as compared to any $O_2$, $O_3$, NO, and $NO_x$, in otherwords such that the conditions are totally void of injection of any such materials to within the reactor during the portion of the deposit.

In a preferred implementation, the high k dielectric layer comprises a titanate, with BST being a preferred titanate. Other example preferred high k dielectric materials include

| | |
|---|---|
| $SrTiO_3$ | ST |
| $BaTiO_3$ | BT |
| $Pb(Zr,Ti)O_3$ | PZT |
| $(Pb,La)(Zr,Ti)O_3$ | PLZT |
| $SrBi_2Ta_2O_9$ | SBT |
| $SrBi_2Nb_2O_9$ | SBN |
| $SrBi_2(Nb,Ta)_2O_9$ | SBNT |
| $Ta_2O_5$ (also doped $Ta_2O_5$, e.g., Ti-doped $Ta_2O_5$) | |
| $ZrO_2$ (also zirconium silicate) | |
| $HfO_2$ (also hafnium silicate) | |

For deposition of BST, example precursors, and by way of example only, include:

| | |
|---|---|
| $Ba(thd)_2$ | bis(tetramethylheptanedionate) |
| $Sr(thd)_2$ | bis(tetramethylheptanedionate) |
| $Ti(thd)_2(O-i-Pr)_2$ | (isopropoxide)bis(tetramethylheptanedionate) |
| $Ba(thd)_2$ | bis(tetramethylheptanedionate) |
| $Sr(thd)_2$ | bis(tetramethylheptanedionate) |
| $Ti(dmae)_4$ | bis(dimethylaminoethoxide) |
| $Ba(methd)_2$ | bis(methoxyethoxyte, tetramethylheptanedionate) |
| $Sr(methd)_2$ | bis(methoxyethoxyte, tetramethylheptanedionate) |
| $Ti(mpd)(thd)_2$ | bis(methylpentanediol, tetramethylheptanedionate) |
| $Ba(dpm)_2$ | bis(dipivaloylmethanato) |
| $Sr(dpm)_2$ | bis(dipivaloylmethanato) |
| $TiO(dpm)_2$ | (titanyl)bis(dipivaloylmethanato) |
| $Ba(dpm)_2$ | bis(dipivaloylmethanato) |
| $Sr(dpm)_2$ | bis(dipivaloylmethanato) |
| $Ti(t-BuO)_2(dpm)_2$ | (t-butoxy)bis(dipivaloylmethanato) |
| $Ba(dpm)_2$ | bis(dipivaloylmethanato) |
| $Sr(dpm)_2$ | bis(dipivaloylmethanato) |
| $Ti(OCH_3)_2(dpm)_2$ | (methoxy)bis(dipivaloylmethanato) |

Adducts (i.e., tetraglyme, trietherdiamine, pentamethyldiethlyenetriamine), solvents (i.e., butylacetate, methanol, tetrahydrofuran), and/or other materials might be utilized with the precursors.

Conductive or dielectric barrier, or other materials, might be provided over electrode layer 14 prior to deposition of layer 16. Further, conductive or dielectric barrier, or other layers, might be provided over high k dielectric layer 16 after its formation prior to fabrication of a subsequent capacitor electrode layer.

The portion of the deposit having the stated high concentration(s) of $N_2O$ might be a small portion, a majority portion, or all of the deposit which forms the exemplary depicted layer 16. Further, the conditions during the deposit might comprise at least one of plasma or remote plasma conditions, or be void of any plasma or remote plasma. Preferably, deposition thickness for layer 16 is no greater than 500 Angstroms, more preferably no greater than 300 Angstroms, and even more preferably no greater than 200 Angstroms.

By way of example only, and where the precursors include metal organic precursors, example flow rates for the various of such precursors include anywhere from 10 mg/min. to 1000 mg/min. of liquid feed to any suitable vaporizer. Preferred $N_2O$ flows include from 100 sccm to 4000 sccm, more preferably between 500 sccm and 2000 sccm, and most preferably between 750 sccm and 1250 sccm. Such flow rates and reduction-to-practice of the invention are with respect to an Applied Materials Centura Frame™ processor. A preferred pressure range is from 100 mTorr to 20 Torr, with a range of from 1 Torr to 6 Torr being more preferred. Susceptor temperature is preferably from 400° C. to 700° C., with less than or equal to 550° C. being even more preferred and in attaining continuity in the deposited layer at thicknesses at or below 200 Angstroms, and preferably at least down to 50 Angstroms. Most preferably, susceptor temperature is kept at less than or equal to 550° C. during all of the deposit to form layer 16 regardless of whether the $N_2O$ is present at the stated concentration(s) during all of the deposit.

Figure 3:
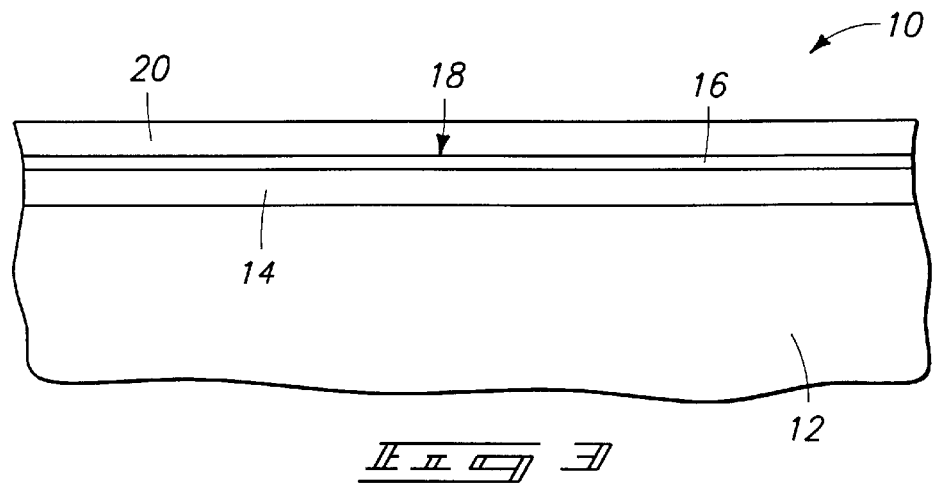
FIG. 3 is a view of the FIG. 1 wafer fragment at a processing step subsequent to that shown by FIG. 2.

The conditions are also preferably effective to form an outermost surface of the high k dielectric layer at conclusion of the portion of the deposit to have a roughness of no greater than 20 Angstroms as determinable by average atomic force microscopy RMS roughness, and more preferably no greater than 15 Angstroms. FIG. 2 depicts high k dielectric layer 16 as having an outer surface 18. FIG. 3 depicts formation of a second capacitor electrode layer 20 over high k capacitor dielectric layer 16, and in the preferred embodiment as shown on (in contact with) outermost surface 18. An example thickness for layer 20 is 200 Angstroms. Again as alluded to above, alternate processing is contemplated whereby conductive or dielectric barrier or other materials might be provided intermediate high k capacitor dielectric layer 16 and second capacitor plate 20. Further, surface 18 may or may not comprise the desired stated roughness, depending perhaps on whether the preferred high concentration(s) of $N_2O$ existed at the conclusion of the deposit to form layer 16.

Preferably, the thickness of total capacitor dielectric material intermediate first capacitor electrode layer 14 and second capacitor electrode layer 20 is no greater than 500 Angstroms, more preferably no greater than 300 Angstroms, and even more preferably no greater than 200 Angstroms.

A reduction-to-practice example in the Applied Materials Centura Frame processor included a susceptor temperature of 500° C. and chamber pressure of 2 Torr. Precursor flows to the vaporizer were $Ba(thd)_2$ and $Sr(thd)_2$ at 25 mg/min., $Ti(thd)_2$ $(O-i-Pr)_2$ at 85 ma/min., Ar to the vaporizer at 150 sccm, Ar as a carrier from the vaporizer at 200 sccm, and $N_2O$ to the reactor at 1200 scam. The precursor liquid ampoules were at room temperature, and the vaporizer at 280° C. Deposition rate was at approximately 20 Angstroms/minute to form a 250 Angstrom thick layer. The produced film was continuous and conformally deposited, having a determined surface roughness of 10 Angstroms.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A chemical vapor deposition method of forming a high k dielectric layer comprising:
   positioning a substrate within a chemical vapor deposition reactor; and
   providing at least one metal comprising precursor and $N_2O$ within the reactor under conditions effective to deposit a high k dielectric layer on the substrate comprising oxygen and the metal of the at least one metal precursor, the $N_2O$ being present within the reactor during at least a portion of the deposit at greater than or equal to at least 90% and less than 100% concentration by volume as compared with any $O_2$, $O_3$, NO, and $NO_X$ injected to within the reactor.

2. The method of claim 1 wherein the $N_2O$ is present within the reactor during the portion of the deposit at greater than or equal to at least 95% concentration by volume as compared with any $O_2$, $O_3$, NO, and $NO_X$ injected to within the reactor.

3. The method of claim 1 wherein the $N_2O$ is present within the reactor during the portion of the deposit at greater than or equal to at least 99% concentration by volume as compared with any $O_2$, $O_3$, NO, and $NO_X$ injected to within the reactor.

4. The method of claim 1 wherein the portion comprises a majority portion.

5. The method of claim 1 wherein the portion comprises all of the deposit.

6. The method of claim 1 wherein the substrate is received on a susceptor, and the conditions during the portion comprise a susceptor temperature of less than or equal to 550° C.

7. The method of claim 1 wherein the substrate is received on a susceptor, and the conditions during all of the deposit comprise a susceptor temperature of less than or equal to 550° C.

8. The method of claim 1 wherein the conditions are effective to form an outermost surface of the high k dielectric layer at conclusion of the portion to have a roughness of no greater than 20 Angstroms as determinable by average atomic force microscopy RMS roughness.

9. The method of claim 1 wherein the conditions are effective to form an outermost surface of the high k dielectric layer at conclusion of the portion to have a roughness of no greater than 15 Angstroms as determinable by average atomic force microscopy RMS roughness.

10. The method of claim 1 wherein the conditions are void of plasma and remote plasma.

11. The method of claim 1 wherein the conditions comprise at least one of plasma or remote plasma.

12. The method of claim 1 wherein the high k dielectric layer comprises a titanate.

13. The method of claim 1 wherein the $N_2O$ is present within the reactor during at least a portion of the deposit at greater than or equal to at least 90% and less than 100% concentration by volume as compared with any $O_2$ injected to within the reactor.

14. The method of claim 1 wherein the $N_2O$ is present within the reactor during at least a portion of the deposit at greater than or equal to at least 90% and less than 100% concentration by volume as compared with any $O_3$ injected to within the reactor.

15. The method of claim 1 wherein the $N_2O$ is present within the reactor during at least a portion of the deposit at greater than or equal to at least 90% and less than 100% concentration by volume as compared with any NO injected to within the reactor.

16. The method of claim 1 wherein the $N_2O$ is present within the reactor during at least a portion of the deposit at greater than or equal to at least 90% and less than 100% concentration by volume as compared with any $NO_X$ injected to within the reactor.

17. A method of forming a capacitor comprising:
   forming a first capacitor electrode layer over a substrate;
   positioning the substrate with the first capacitor electrode layer within a chemical vapor deposition reactor;
   providing at least one metal comprising precursor and $N_2O$ within the reactor under conditions effective to deposit a high k capacitor dielectric layer comprising oxygen and the metal of the at least one metal precursor over the first capacitor electrode, the $N_2O$ being present within the reactor during at least a portion of the deposit at greater than or equal to at least 90% and less than 100% concentration by volume as compared with any $O_2$, $O_3$, NO, and $NO_X$ injected to within the reactor to form an outermost surface of the capacitor dielectric layer at conclusion of the portion to have a roughness of no greater than 20 Angstroms as determinable by average atomic force microscopy RMS roughness; and forming a second capacitor electrode layer over the high k capacitor dielectric layer.

18. The method of claim 17 wherein the second capacitor electrode layer is formed on the high k capacitor dielectric layer.

19. The method of claim 17 wherein the second capacitor electrode layer is formed on the outermost surface.

20. The method of claim 17 wherein thickness of total capacitor dielectric material intermediate the first and second capacitor electrode layers is no greater than 500 Angstroms.

21. The method of claim 17 wherein thickness of total capacitor dielectric material intermediate the first and second capacitor electrode layers is no greater than 300 Angstroms.

22. The method of claim 17 wherein thickness of total capacitor dielectric material intermediate the first and second capacitor electrode layers is no greater than 200 Angstroms.

23. The method of claim 17 wherein the conditions are effective to form said roughness to be no greater than 15 Angstroms.

24. The method of claim 17 wherein the $N_2O$ is present within the reactor during the portion of the deposit at greater than or equal to at least 95% concentration by volume as compared with any $O_2$, $O_3$, NO, and $NO_X$ injected to within the reactor.

25. The method of claim 17 wherein the $N_2O$ is present within the reactor during the portion of the deposit at greater than or equal to at least 99% concentration by volume as compared with any $O_2$, $O_3$, NO, and $NO_X$ injected to within the reactor.

26. The method of claim 17 wherein thickness of total capacitor dielectric material intermediate the first and second capacitor electrode layers is no greater than 500 Angstroms, and wherein the $N_2O$ is present within the reactor during the portion of the deposit at greater than or equal to at least 95% concentration by volume as compared with any $O_2$, $O_3$, NO, and $NO_X$ injected to within the reactor.

27. The method of claim 17 wherein thickness of total capacitor dielectric material intermediate the first and second capacitor electrode layers is no greater than 500 Angstroms, and wherein the $N_2O$ is present within the reactor during the portion of the deposit at greater than or equal to at least 99% concentration by volume as compared with any $O_2$, $O_3$, NO, and $NO_X$ injected to within the reactor.

28. The method of claim 17 wherein the $N_2O$ is present within the reactor during at least a portion of the deposit at greater than or equal to at least 90% and less than 100% concentration by volume as compared with any $O_2$ injected to within the reactor.

29. The method of claim 17 wherein the $N_2O$ is present within the reactor during at least a portion of the deposit at greater than or equal to at least 90% and less than 100% concentration by volume as compared with any $O_3$ injected to within the reactor.

30. The method of claim 17 wherein the $N_2O$ is present within the reactor during at least a portion of the deposit at greater than or equal to at least 90% and less than 100% concentration by volume as compared with any NO injected to within the reactor.

31. The method of claim 17 wherein the $N_2O$ is present within the reactor during at least a portion of the deposit at greater than or equal to at least 90% and less than 100% concentration by volume as compared with any $NO_X$ injected to within the reactor.

32. A method of forming a capacitor comprising:
    forming a first capacitor electrode layer over a substrate;
    positioning the substrate with the first capacitor electrode layer within a chemical vapor deposition reactor;
    providing at least one metal comprising precursor and $N_2O$ within the reactor under conditions effective to deposit a high k capacitor dielectric layer comprising oxygen and the metal of the at least one metal precursor over the first capacitor electrode, the $N_2O$ being present within the reactor during at least a portion of the deposit at greater than or equal to at least 95% and less than 100% concentration by volume as compared with any $O_2$, $O_3$, NO, and $NO_X$ injected to within the reactor to form an outermost surface of the capacitor dielectric layer at conclusion of the portion to have a roughness of no greater than 15 Angstroms as determinable by average atomic force microscopy RMS roughness; and
    forming a second capacitor electrode layer over the high k capacitor dielectric layer, and wherein thickness of total capacitor dielectric material intermediate the first and second capacitor electrode layers is no greater than 300 Angstroms.

33. The method of claim 32 wherein the $N_2O$ is present within the reactor during the portion of the deposit at greater than or equal to at least 99% concentration by volume as compared with any $O_2$, $O_3$, NO, and $NO_X$ injected to within the reactor.

34. The method of claim 32 wherein the $N_2O$ is present within the reactor during at least a portion of the deposit at greater than or equal to at least 95% and less than 100% concentration by volume as compared with any $O_2$ injected to within the reactor.

35. The method of claim 32 wherein the $N_2O$ is present within the reactor during at least a portion of the deposit at greater than or equal to at least 95% and less than 100% concentration by volume as compared with any $O_3$ injected to within the reactor.

36. The method of claim 32 wherein the $N_2O$ is present within the reactor during at least a portion of the deposit at greater than or equal to at least 95% and less than 100% concentration by volume as compared with any NO injected to within the reactor.

37. The method of claim 32 wherein the $N_2O$ is present within the reactor during at least a portion of the deposit at greater than or equal to at least 95% and less than 100% concentration by volume as compared with any $NO_X$ injected to within the reactor.

* * * * *

UNITED STATES PATENT AND TRADEMARK OFFICE
CERTIFICATE OF CORRECTION

PATENT NO.   : 6,335,049 B1
DATED        : January 1, 2002
INVENTOR(S)  : Cem Basceri It is certified that error appears in the above-identified patent and that said Letters Patent is hereby corrected as shown below:

<u>Column 5,</u>
Line 37, replace "at 85 ma/min., Ar" with -- at 85 mg/min., Ar --.

Signed and Sealed this

Twenty-first Day of May, 2002

Attest:

JAMES E. ROGAN
*Attesting Officer*   *Director of the United States Patent and Trademark Office*